(12) United States Patent
Burke

(10) Patent No.: US 8,536,625 B2
(45) Date of Patent: Sep. 17, 2013

(54) ELECTRONIC SHUTTER WITH PHOTOGENERATED CHARGE EXTINGUISHMENT CAPABILITY FOR BACK-ILLUMINATED IMAGE SENSORS

(75) Inventor: Barry E. Burke, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 282 days.

(21) Appl. No.: 12/878,082

(22) Filed: Sep. 9, 2010

(65) Prior Publication Data

US 2011/0062499 A1 Mar. 17, 2011

Related U.S. Application Data

(60) Provisional application No. 61/241,424, filed on Sep. 11, 2009.

(51) Int. Cl.
*H01L 27/148* (2006.01)

(52) U.S. Cl.
USPC ........... 257/222; 257/213; 257/216; 257/228; 257/230; 257/233; 257/292; 257/297; 257/396; 257/461; 257/628; 257/E27.131; 257/E27.133; 257/27.15; 257/E31.084; 257/E31.096; 438/73; 438/84; 438/144; 438/196; 438/308; 438/311; 438/324; 438/424; 250/214.1; 250/208.1

(58) Field of Classification Search
USPC ................. 257/213–216, 222, 228–230, 233, 257/292, 297, 396, 461, 627, 628, E27.131–E27.133, E27.15, E31.084, E31.096; 438/73, 84, 144, 438/196, 308, 311–324, 424; 250/214.1, 250/208.1

See application file for complete search history.

(56) References Cited

U.S. PATENT DOCUMENTS 7,091,530 B1 * 8/2006 Reich et al. .................... 257/222

* cited by examiner

*Primary Examiner* — Meiya Li
(74) *Attorney, Agent, or Firm* — Theresa A. Lober

(57) ABSTRACT

An electronic image sensor includes a semiconductor substrate having a first surface configured for accepting illumination to a pixel array disposed in the substrate. An electrically-doped channel region for each pixel is disposed at a second substrate surface opposite the first substrate surface. The channel regions are for collecting photogenerated charge in the substrate. An electrically-doped channel stop region is at the second substrate surface between each channel region. An electrically-doped shutter buried layer, disposed in the substrate at a depth from the second substrate surface that is greater than that of the pixel channel regions, extends across the pixel array. An electrically-doped photogenerated-charge-extinguishment layer, at the first substrate surface, extends across the pixel array. A substrate bulk region between the shutter buried layer and the photogenerated-charge-extinguishment layer is characterized by an electrical resistivity enabling independent electrical bias of the photogenerated-charge-extinguishment layer from electrically-doped regions of the substrate.

15 Claims, 4 Drawing Sheets

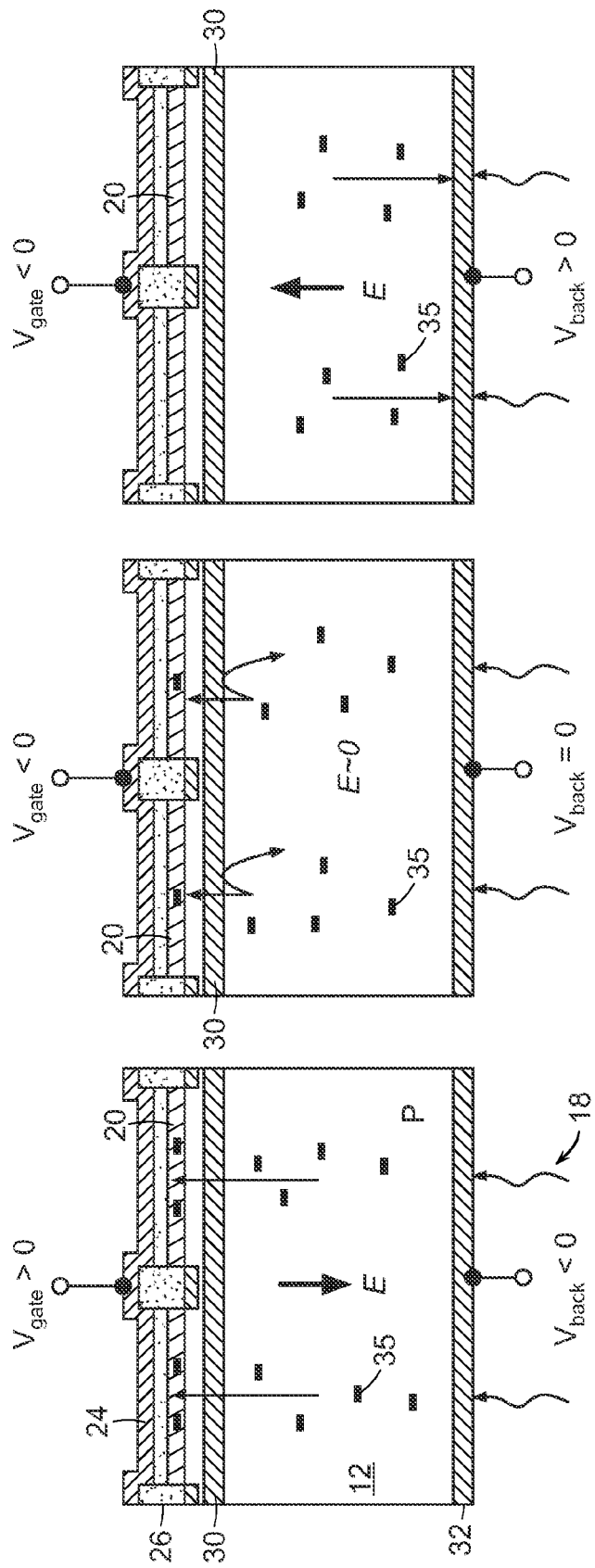

ELECTRONIC SHUTTER WITH PHOTOGENERATED CHARGE EXTINGUISHMENT CAPABILITY FOR BACK-ILLUMINATED IMAGE SENSORS

CROSS-REFERENCE TO RELATED APPLICATION

This application claims the benefit of U.S. Provisional Application No. 61/241,424, filed Sep. 11, 2009, the entirety of which is hereby incorporated by reference.

STATEMENT REGARDING FEDERALLY SPONSORED RESEARCH

This invention was made with Government support under Contract No. FA8721-05-C-0002 awarded by the Department of Defense. The Government has certain rights in the invention.

BACKGROUND OF INVENTION

This invention relates generally to solid state electronic image sensors, and more particularly relates to configurations for shuttering electronic image sensors.

There have been proposed a range of configurations for enabling electronic shuttering of image sensors such as charge-coupled device (CCD) imagers. Image sensors including electronic shutter capabilities have proven to be valuable for a wide range of imaging applications in which mechanical shuttering of an image sensor would not be sufficiently fast, such as for adaptive optics with laser guide stars. In such an application, the image sensor must be shuttered on a time scale in the microsecond regime. Focal-plane arrays of CCD imagers configured for astronomy and surveillance are also optimally controlled with electronic shuttering, because although the required shutter speeds can be relatively slow, the large detector areas of the device, as well as physical space constraints of the device, pose a serious challenge to the design of mechanical shutters. For example, there has been proposed a focal-plane array of approximately 0.64 meters in diameter for the large synoptic survey telescope (LSST). Such a scale does not easily lend itself to a mechanical shutter design.

In an electronic shutter configuration for an image sensor, there is in general provided for each pixel a buried doped layer that modifies the electrical potential beneath the pixel channel region. The doping and depth of the buried layer are adjusted so that, depending on the electrical potential applied to the gate electrode of the pixel, photogenerated electrical charge in the substrate bulk either flows freely into the channel region of the pixel, in a shutter 'open' state, or is re-directed away from the channel region, via control of electric fields in the substrate, in a shutter 'closed' state.

With this shutter design, there is conventionally included some arrangement for a shutter drain at each image sensor pixel that can drain the re-directed photogenerated charge from the bulk when the pixel is biased in the shutter 'closed' state and the image sensor is illuminated and therefore continuing to generate photocharge. Conventionally, shutter drain regions are provided on the front, circuit side of an image sensor, disposed in channel stop regions adjacent to pixel gate electrodes. With such a configuration, the shutter drain can be biased with an electrical voltage that produces substantial charge-collection electric fields that extend laterally beneath the pixel. These fields direct unwanted photocharge to the drain regions on the front side of the substrate where the charge is dumped to an external circuit until such time as the shutter is to be again switched to the 'open' state.

While this shutter drain operation is in principal quite effective, it has been found that for many applications it can be very difficult or not practical to implement an electronic shutter with shutter drains in an image sensor device. For example, the channel stops in the orthogonal-transfer CCD, or OTCCD, consist of isolated islands. Embedding a shutter drain in these islands is possible, but electrical connections must be made to every such drain, leading to a dense array of metal lines across the front circuit side of the device. More importantly, pixel gate electrodes for the pixels must be pushed aside to make room for contacts to the adjacent drain regions. This is difficult in an OTCCD because the channel stops are a convenient place to interconnect gates across neighboring pixels. As a result, pixel design and layout constraints for including a full shutter implementation, including shutter drains, in image sensors such an OTCCD can significantly limit the ability to include an electronic shutter configuration in an image sensor. But without an electronic shutter implementation, many image sensor applications cannot be successfully implemented.

SUMMARY OF THE INVENTION

The invention provides an electronic shutter configuration that overcomes design and fabrication requirements of previous shutter arrangements. An example of such an electronic image sensor includes a semiconductor substrate having a first surface configured for accepting illumination to an array of image sensor pixels disposed in the substrate. An electrically-doped channel region is provided for each pixel and is disposed at a second substrate surface opposite the first substrate surface. The channel region of each pixel is provided for collecting photogenerated charge in the substrate at each pixel in the array. An electrically-doped channel stop region is provided at the second substrate surface between each channel region An electrically-doped shutter buried layer is disposed in the substrate at a depth from the second substrate surface that is greater than that of the pixel channel regions. The shutter buried layer extends across the pixel array in the substrate. An electrically-doped photogenerated-charge-extinguishment layer is provided at the first substrate surface. This photogenerated-charge-extinguishment layer extends across the pixel array in the substrate. A substrate bulk region that is between the shutter buried layer and the photogenerated-charge-extinguishment layer is characterized by an electrical resistivity that enables independent electrical bias of the photogenerated-charge-extinguishment layer from other electrically-doped regions of the substrate.

With this arrangement, the electronic shutter enables a shutter 'open' condition for collection of photogenerated charge in the substrate and a shutter 'closed' condition for extinguishing of photogenerated charge in the substrate. No draining of charge from the substrate to an external circuit is required during the shutter 'closed' condition, and no drain structures are included in the pixel. As a result, the electronic shutter eliminates the need for excess electrical contacts and metallization on an image sensor. A wide class of image sensors is well-addressed by this electronic shutter design.

Other features and advantages of the invention will be apparent from the following description and accompanying figures, and from the claims.

BRIEF DESCRIPTION OF THE DRAWINGS

FIGS. 2A-2C are schematic cross-sectional side views of the CCD pixel of FIG. 1 with electrical biases of the pixel set for a shutter 'open' condition, for a shutter 'partially closed' condition, and for a shutter 'closed' condition, respectively;

DETAILED DESCRIPTION

Figure 1:
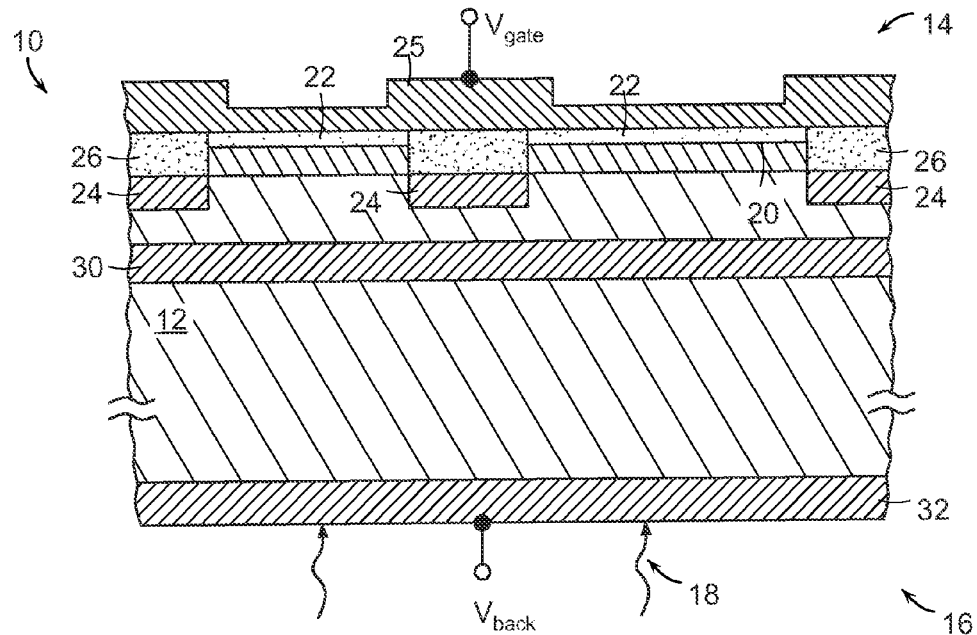
FIG. 1 is a schematic cross-sectional side view of an example CCD pixel including an electronic shutter configuration with the capability to extinguish substrate photocharge.

FIG. 1 is a schematic cross-sectional view of an electronic shutter implementation 10 configured in a pixel of a CCD image sensor pixel array. This pixel implementation is discussed in detail as one example and is not limiting; the electronic shutter can be implemented in any suitable image sensor configuration. As shown in FIG. 1, there is provided a solid state semiconducting substrate 12 such as a silicon substrate. The front surface 14 of the substrate is configured with pixel gate electrodes and circuitry as described below. The back surface 16 of the substrate is arranged for accepting illumination 18 to the image sensor, in a back-illuminated sensor configuration.

The pixel includes a channel, e.g., a buried channel 20, for collecting photogenerated charge that is generated in the substrate in response to back-illumination of the substrate. A gate oxide region 22 is provided on the buried channel 20, separating the channel from a gate electrode layer 25. Doped channel stop regions 24 are provided under field oxide regions 26 for defining edges of each pixel channel in the pixel array. In the conventional manner, each channel stop region 24 is connected at ground potential. With this arrangement, electrical contact can be made to a gate electrode 25 to apply a gate voltage, $V_{gate}$, to a selected gate to bias a pixel for collection of photogenerated charge at the buried channel. Only one electrical gate connection is shown in the figure for clarity.

A shutter buried layer 30 is provided in the substrate a depth from the front substrate surface, e.g., under the buried channel. The shutter buried layer extends across the pixel array in the substrate. The shutter buried layer 30 is shown here at a constant depth but such is not required; the shutter buried layer can be provided with varying depth across a pixel and across the pixel array. As explained in detail below, the shutter layer depth, as well as doping type and doping level, are selected such that under shutter 'open' conditions a depletion layer is established through the thickness of the substrate 12 to the back surface 16 to direct and collect photogenerated charge in the substrate at the channel 20. For many applications, the buried shutter layer doping and depth can be selected in the manner described in U.S. Pat. No. 5,270,558, issued Dec. 14, 1993, to Reich et al., the entirety of which is hereby incorporated by reference.

At the back surface 16 of the substrate there is provided a photogenerated-charge-extinguishment layer 32. The photogenerated-charge-extinguishment layer is of a doping level that is sufficient to extinguish photogenerated charge that is directed to the back surface 16 under shutter 'closed' conditions, as explained below. Antireflective coatings can be applied to the photogenerated-charge-extinguishment layer 32 for enhancing the performance of the back-illumination configuration, and an electrical connection, $V_{back}$, is provided to the photogenerated-charge-extinguishment layer 32. This connection is shown schematically in the figure at the back surface 16, but as explained below, any suitable connection to the photogenerated-charge-extinguishment layer is sufficient.

In accordance with this pixel array shutter configuration, the substrate 12 is provided as a high-resistivity semiconducting material that is sufficiently insulating to electrically decouple the electrical potential set at the charge photogenerated-charge-extinguishment 32 at the substrate back surface from the electrical ground potential imposed by the channel stop regions 24 at the substrate front surface. As a result, the photogenerated-charge-extinguishment layer 32 can be electrically biased independently of the front side sensor circuitry to independently set the electrical potential, and electric field, in the bulk of the substrate.

FIGS. 2A-2C are schematic cross-sectional views of the pixel and shutter shown at various states of shutter condition. These conditions are shown for an example shutter arrangement for an n-type channel device employing a p-type substrate, a $p^+$ shutter buried layer, a $p^+$ photogenerated-charge-extinguishment layer, and an n-type channel layer, but such is not required; it is to be understood that an n-type substrate of sufficiently high resistivity could also be employed for an n-type channel device. Likewise, a p-type channel device can employ a substrate of either electrical dopant conduction type but with an $n^+$ shutter buried layer, an $n^+$ photogenerated-charge-extinguishment layer, and a p-type channel layer.

Referring first to FIG. 2A, there is shown the pixel condition when the shutter control is set to an 'open' state. This 'open' state is obtained for the p-type substrate when the gate bias, $V_{gate}$, is set to a voltage that is greater than a characteristic positive threshold voltage for the pixel, e.g., some sufficiently high positive voltage, and the substrate bias, $V_{back}$, at the back surface photogenerated-charge-extinguishment layer 32 is set electrically negative. As the back surface of the substrate is exposed to illumination 18, photoelectrons 35 are generated in the substrate. When the gate and back surface biases are of sufficient magnitude and of the polarities shown, the shutter buried layer 30 is depleted. As a result, photoelectrons 35 in the substrate are drawn by the electric field, E, over the depleted shutter buried layer 30, into the CCD channel 20. This shutter 'open' condition can be enforced for a selected image acquisition duration at the image sensor to collect photogenerated charge in the substrate at each pixel in the array of pixels.

Referring to FIG. 2B, when the gate voltage, $V_{gate}$, is set to some low or negative voltage below zero less than the threshold voltage and the back substrate bias, $V_{back}$, is set to zero, the shutter buried layer 30 becomes un-depleted, i.e., is now electrically conducting, and as a result, the electric field between the shutter buried layer 30 and the back surface photogenerated-charge-extinguishment layer 32 is zero, E=0. Under these conditions there are no electrostatic forces on photoelectrons 35 generated in the substrate 12, and as a result, the photoelectrons accumulate in the substrate beneath the shutter buried layer 30. While the shutter buried layer 30 does under this condition produce a modest electrostatic barrier to the photoelectrons, the thermal energy of the photoelectrons can allow some number of photoelectrons to penetrate the shutter layer. In this situation the shutter is therefore said to be 'partially closed.'

Referring to FIG. 2C, if the back substrate bias, $V_{back}$, is set to a positive electrical potential and the gate voltage, $V_{gate}$, is maintained, as in the condition of FIG. 2B, at some low or negative voltage less than the threshold voltage, the shutter buried layer 30 is again un-depleted, i.e., electrically conducting, and here the internal electric field, E, in the substrate reverses direction from the shutter 'open' condition. As a result, photoelectrons generated in the substrate are drawn to the back surface photogenerated-charge-extinguishment layer 32. When the back substrate bias, $V_{back}$, is of a sufficiently positive magnitude, photoelectrons in the substrate can no longer surmount the potential of the shutter buried layer 30 and therefore cannot reach the channel 20. With this condition, the pixel shutter is in the shutter 'closed' state.

In this condition, the back surface photogenerated-charge-extinguishment layer 32 extinguishes the photoelectrons as the electric field directs the photoelectrons to the photogenerated-charge-extinguishment layer. Once at the photogenerated-charge-extinguishment layer, the photoelectrons recombine with holes, given this example that the photogenerated-charge-extinguishment layer is p-type, thereby extinguishing the photoelectrons. As a result, no shutter drain or other electrical connection to the pixel is included or required to remove photogenerated charge, e.g., photoelectrons, from the substrate during a shutter 'closed' condition. Instead, the shutter extinguishes the photogenerated charge right in the substrate, at the photogenerated-charge-extinguishment layer. By providing a substrate of sufficient resistivity that the photogenerated-charge-extinguishment layer at the back surface can be electrically biased independently of the front field stop regions, the shutter enables control of the electric field in the substrate, specifically enabling reversing of the electric field, to direct photogenerated charge to the back surface photogenerated-charge-extinguishment layer for extinguishing the photogenerated charge at the back surface.

In fabrication of a pixel array including the electronic shutter described above, a solid state semiconducting substrate, e.g., a silicon substrate, is employed in which to fabricate an array of pixels each including a shutter configuration. As just explained, the selected substrate is of a relatively high resistivity that enables the substrate to electrically isolate the substrate front surface circuitry and doped regions from the substrate back surface and photogenerated-charge-extinguishment layer. Given the use of a silicon substrate, a substrate resistivity of at least about several thousand ohm-cm can be suitable for this electrical isolation functionality.

In one example fabrication sequence a shuttered pixel array is fabricated as an array of n-channel CCDs as described above. Here the starting material consists of a high-resistivity n-type or p-type silicon wafer. The resistivity of the wafer is preferably greater than about 3000-5000 Ω-cm. The electronic shutter can be applied equally well to p-channel CCDs or to CMOS active-pixel sensor, provided the various device dopant types are switched accordingly. The discussion below applies to an example of n-type channel CCDs but such is therefore not limiting.

Referring to the pixel structure of FIG. 1, the fabrication begins with a silicon wafer having the requisite resistivity, upon which is grown or deposited a gate dielectric film or films 22. In one example, an oxide, e.g., $SiO_2$, is thermally grown at a high temperature on the wafer in an ambient of $O_2$ or $H_2O$. If desired, deposited layers of $Si_3N_4$ or $SiO_2$ can further be included in the gate oxide layer. In one specific example, a gate dielectric of a 60 nm-thick layer of thermal $SiO_2$ and a 40 nm-thick layer of $Si_3N_4$ can be formed in the conventional manner.

After the gate dielectric is formed, the shutter buried layer 30 is formed in the substrate by a suitable process, e.g., by high-energy ion implantation. Prior to the implantation, photoresist coating and lithographic patterning are conducted to protect non-pixel areas of the wafer that are to be shielded from the implantation. The entire unprotected pixel array area is then exposed to a selected ion implantation step so that the pixel array is blanket-implanted. As a result, the shutter buried layer 30 extends across the pixel array. Given an n-type channel image sensor, the shutter buried layer is p-type. For this example, an implantation species of boron can be employed, with an implantation energy of, e.g., about 600 keV, and a dose of, e.g., about $4.5 \times 10^{11}$ cm$^{-2}$. This implantation step results in a buried p-type layer that is approximately 1.1 μm below the silicon surface. As will be recognized, there is a range of implantation doses over which the shutter buried layer can operate satisfactorily for any given implantation energy, and there is a range of implantation energies that can be successfully employed.

The channel stops are fabricated by, e.g., photoresist-based lithographic patterning to expose regions of the gate dielectric that are to become channel stops. For example, given a gate dielectric layer of silicon nitride and silicon oxide, the silicon nitride is etched away and possibly some of the silicon dioxide is removed at the locations for the channel stops. With the photoresist still in place over the other pixel areas, an ion implantation step is then performed with a p-type species, e.g., boron, at an implantation energy that is sufficient to penetrate any gate oxide that was left intact, and a dose of about $7.0 \times 10^{12}$ cm$^{-2}$, to thereby form doped channel stop regions 24.

After the implantation step, the photoresist is stripped, and the wafer is subjected to an oxidation step that produces the field oxide layer 26. The silicon nitride of the gate dielectric layers 22 that are outside the channel-stop regions 24 mask the gate dielectric from the oxidizing species so that gate dielectric 22 remains unchanged during the oxidation. Doping of the channel stop regions 24 can be at, e.g., an acceptor level of about $10^{17}$ cm$^{-3}$. The thickness of the field oxide regions 26 can be about, e.g., 500 nm.

The image sensor buried channels 20 of the pixel array can be fabricated at this point or at another suitable point in the process. The channel consists of a layer of dopant corresponding to the electrical conduction type of the photogenerated charge carriers that the channel collects. For example, n-type pixel channels collect photogenerated charge carriers that are electrons, and so the buried channel of each pixel is in this example therefore formed with an n-type dopant.

The preferred method of creating the buried channel is by ion implantation. In one example n-type channel formation process, phosphorus ions are implanted at an energy of, e.g., about 150 keV, and dose of, e.g., about $1.7 \times 10^{12}$ cm$^{-2}$, through a gate dielectric layer or layers that were previously formed. This dose is higher than that conventionally employed for unshuttered pixels, (e.g., about $1.3 \times 10^{12}$ cm$^{-2}$) because the presence of the shutter buried layer affects the performance of the buried channel by offsetting the threshold voltage of the channel, and one can compensate for this by increasing the channel implant dose as in this example.

In addition, in accordance with the invention there can be performed an additional ion implantation step, herein called the trough implantation, at an implantation energy of, e.g., about 150 keV, and an implantation dose of, e.g., about $3.9 \times 10^{12}$ cm$^{-2}$. The trough implantation is confined to a selected region, e.g., 2-μm-wide region, in the center of the CCD channel, in contrast to the buried channel implant which covers the entire channel width out to the channel-stop edges.

The trough is not an essential part of the invention, and can be employed, e.g., when desired for enhancing the charge-handling capacity of the image sensor as well as improving the hardness of the image sensor to certain types of space radiation.

At this point, the general CCD structures can be produced. For example, a layer of gate electrode material, e.g., polysilicon, for example in a layer of about 200-350 nm thick, is deposited and etched to define the first set of gates. In one example process, these gates are then oxidized to form a 'skin' of about 100 nm in thickness of $SiO_2$ over the first set of gates. A second gate electrode layer of polysilicon can then likewise be deposited and patterned to form a second set of gates, partially overlapping the first set of gates, and then oxidized. This process can be repeated any number of selected cycles, e.g., a third or fourth time, to produce a selected full set of gate electrodes that are needed for a given image sensor pixel array operation.

To complete the front-side substrate processing, Doping implantations can be conducted to form MOSFETs as-needed for charge-sensing circuitry, in the conventional manner. Electrical contacts and metallization are then formed to complete the circuitry on the front side of the image sensor, in the conventional manner.

To complete the shutter configuration for the image sensor, the photogenerated-charge-extinguishment layer 32 at the back surface of the substrate is formed. In one example, the photogenerated-charge-extinguishment layer is a heavily doped layer on the substrate back surface, e.g., a heavily-doped p-type layer at the back surface of an image sensor configured with an n-type channel. The photogenerated-charge-extinguishment layer can be provided in any suitable thickness; e.g., as a relatively thin layer for ITV image sensor operation, or somewhat thicker for visible and near IR image sensor operation. In this case, a photogenerated-charge-extinguishment layer of, e.g., about 200-300 nm in thickness can be employed.

As explained above, photogenerated charge, e.g., photoelectrons, that are generated in the substrate when the electronic shutter is controlled in a 'closed' condition, so that the shutter buried layer is undepleted, are attracted by the electric field in the substrate bulk to the photogenerated-charge-extinguishment layer and are extinguished the in the photogenerated-charge-extinguishment layer. When the substrate is electrically biased positive to produce within the substrate an electric field that attracts photoelectrons to the photogenerated-charge-extinguishment layer, the photoelectrons in the substrate reaching the layer recombine with dopant holes in the layer.

In a practical device, the direct recombination of electrons and holes can be extremely difficult where the device is implemented in silicon. In high-purity silicon that is conventionally employed for image sensors, the carrier lifetime of photogenerated charged is known to be on the order of milliseconds or more, which is much too long for an electronic shutter cycle. Therefore, in order to ensure efficient extinction of the electrons in the substrate, it is preferred to rely on so-called Auger recombination.

Figure 3:
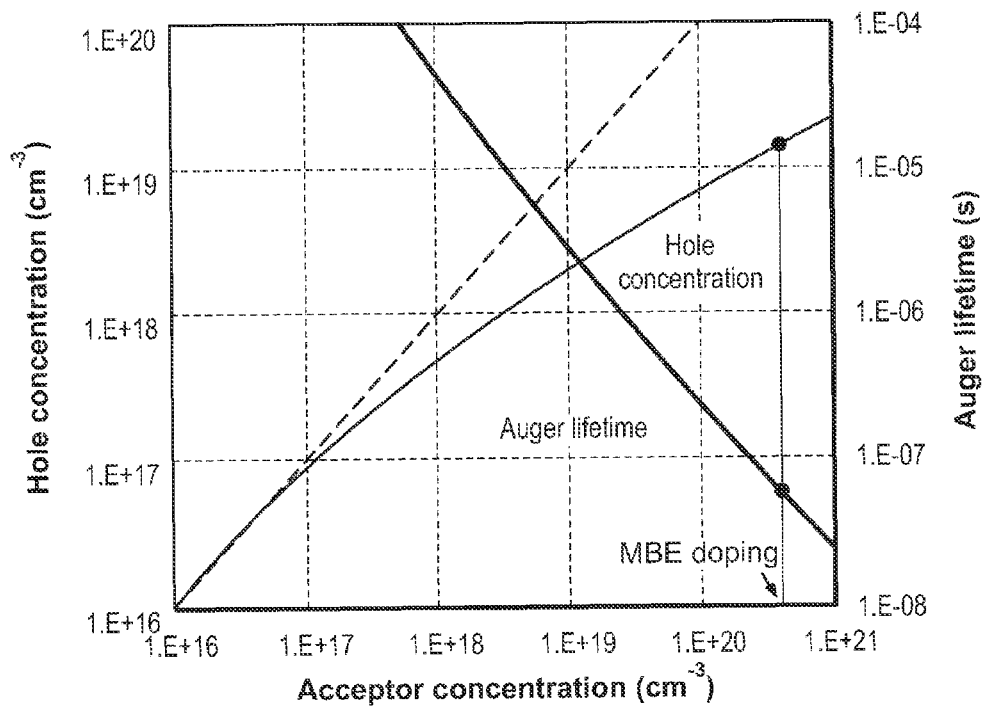
FIG. 3 is a plot of hole concentration and Auger electron lifetime as a function of acceptor concentration, for determining requisite doping levels of the charge collection layer in the pixel of FIG. 1.

Referring to FIG. 3, there is shown a plot of electron lifetime as a function of the doping (acceptor) concentration in a $p^+$ photogenerated-charge-extinguishment layer. Auger recombination requires a high concentration of holes, as illustrated in the plot. This plot can be employed for determining a photogenerated-charge-extinguishment layer doping level that can extinguish photoelectrons in a sufficiently fast period of time.

In one example process, molecular-beam epitaxy (MBE) can be employed at the back substrate surface to produce levels that reduce electron lifetime to less than 100 ns. MBE is an attractive process because of the relatively low temperatures required; low temperature processing is preferred to preserve the front-side circuitry on the substrate. In a further example, the back surface of the substrate can be doped by implantation, e.g., with a shallow boron implantation step, followed by an annealing step, e.g., a pulsed laser anneal, to minimize thermal impact on the front side circuitry. The photogenerated-charge-extinguishment layer doping level resulting from this example implantation process is about $3 \times 10^{19}$ cm$^3$, suggesting that photoelectron lifetimes of about 1 µs are adequate. In general, photogenerated-charge-extinguishment layer doping at a level greater than about $10^{19}$ cm$^3$ can be employed for many applications.

With the photogenerated-charge-extinguishment layer in place, any additional selected back surface layers can be formed as-desired, e.g., including anti-reflection coatings or other materials for enhancing the back-illumination configuration of the image sensor. An electrical connection to the photogenerated-charge-extinguishment layer can be made directly at the back surface of the substrate, or can be made at another suitable location. For example, electrical contact to the photogenerated-charge-extinguishment layer can be made on the front side of the substrate at the pixel array periphery, at a location at which sufficient electrical conduction through the substrate enables effective voltage biasing of the back side photogenerated-charge-extinguishment layer.

Figure 4A:
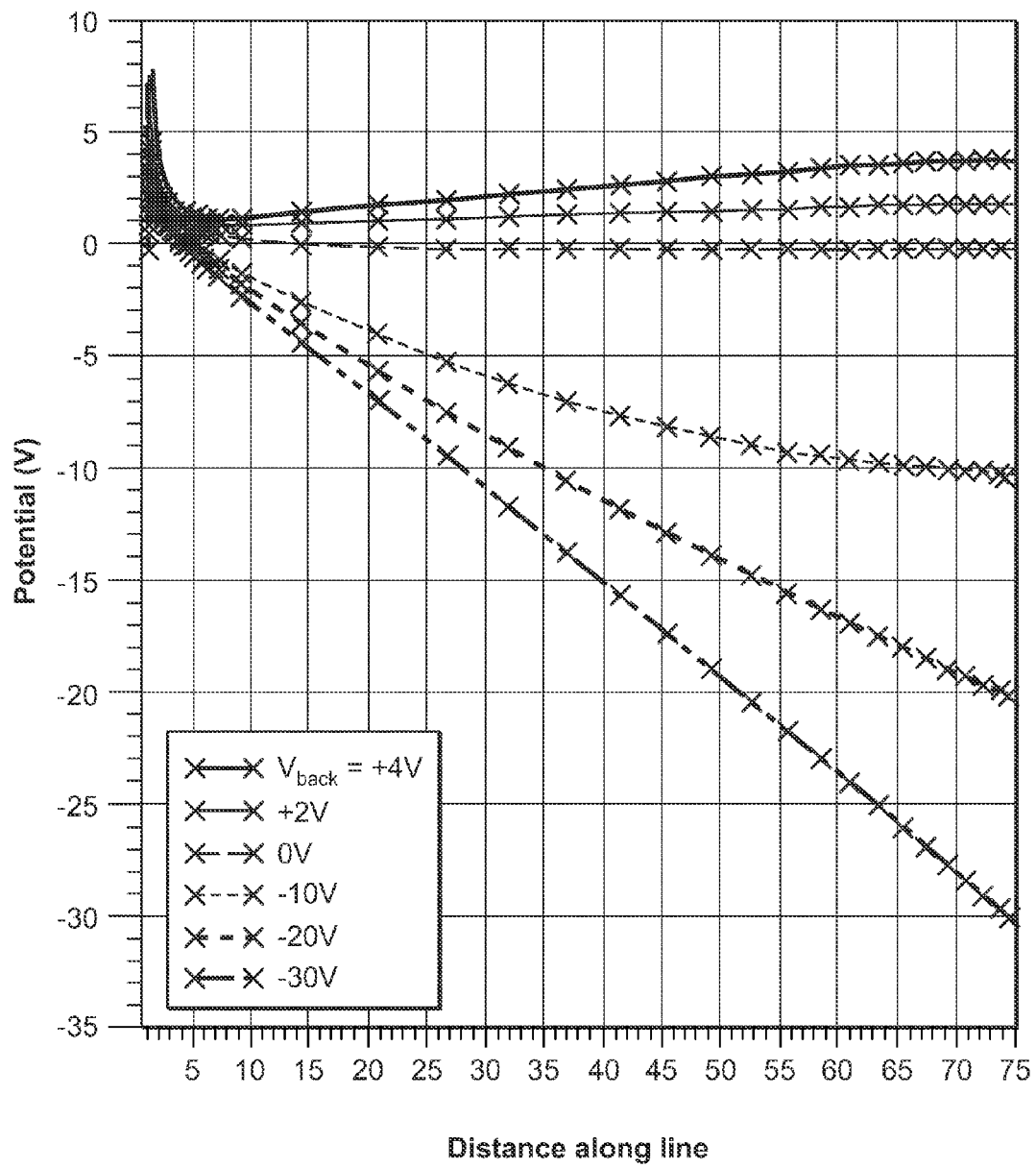
FIGS. 4A-4B are plots of the electric potential through the depth of a substrate including an array of the pixels of FIG. 1 for various backside substrate biases.
Figure 4B:
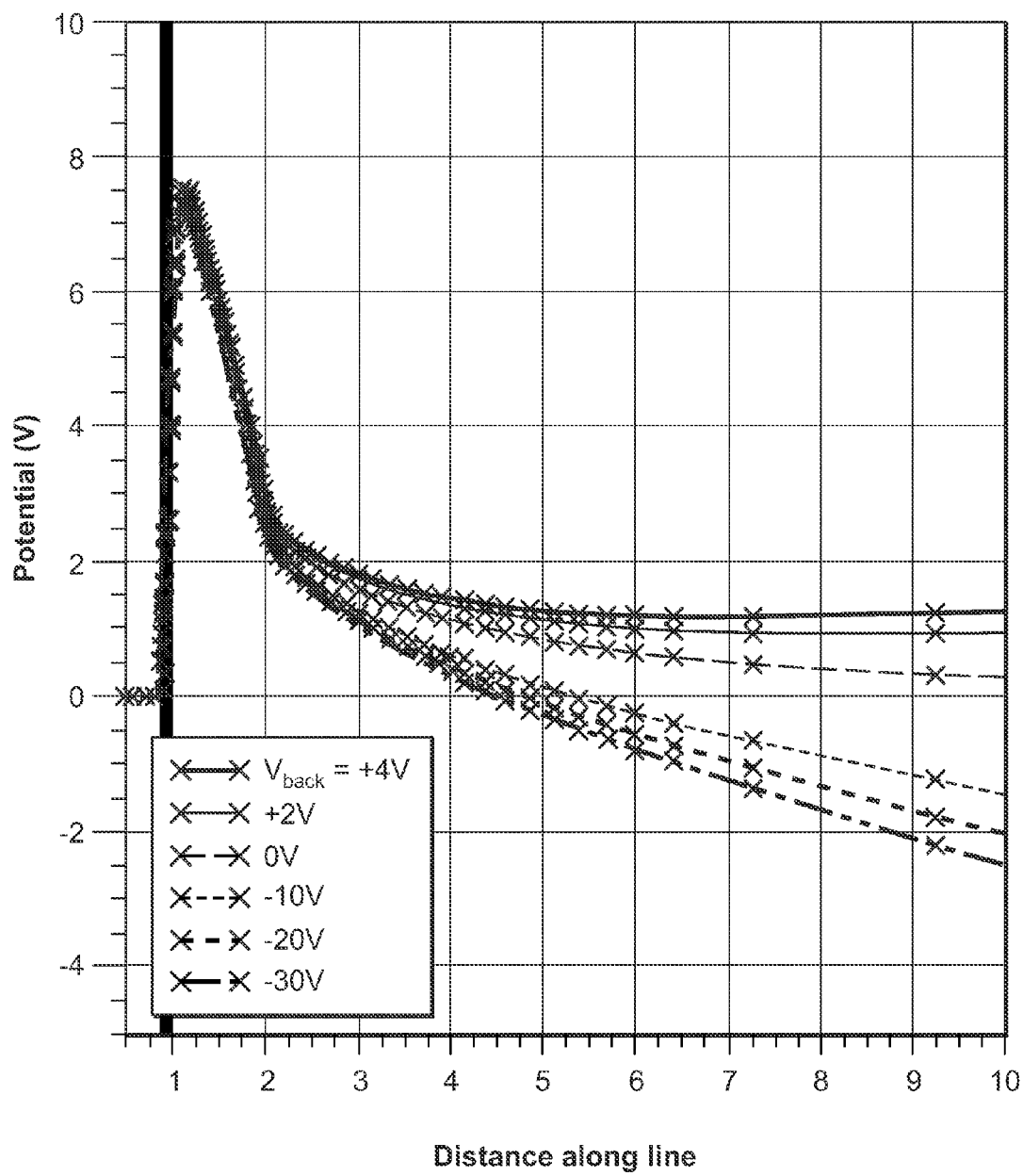

Based on the selected doping characteristics of a selected fabrication process, there can be determined the operation of the resulting pixel and electronic shutter configuration. FIG. 4A plots the electrical potential, or electric field, through the thickness of a 75 µm-thick pixel array having the pixel structure of FIG. 1. The plots are provided for various substrate back surface photogenerated-charge-extinguishment layer bias voltages between −30 and +4 V, for a p-type substrate. The gate voltage is held at zero. These plots are based on a buried shutter layer ion implantation dose of $3 \times 10^{11}$ cm$^{-2}$ and the example re-channel fabrication specifications given above. FIG. 4B is a view of the plots of FIG. 4A for the first 10 µm of the pixel array.

The sharply peaked potential in the first two microns at the substrate surface is the potential well created by the buried channel implantation and is where the photoelectrons are collected when in the shutter 'open' condition. As shown by the plots, when the photogenerated-charge-extinguishment layer is biased strongly negative, a strong electric field attracts photoelectrons generated in the substrate toward the left, i.e., the substrate surface, into the buried channel in the pixel condition shown in FIG. 2A. Under the reverse condition of a positive substrate bias, the electric field direction is reversed and the photoelectrons can only drift to the back surface.

With this description and demonstration of operation, it is shown that the electronic shutter effectively enables the extinguishing of photogenerated charge in the substrate during shutter 'closed' conditions. No draining of charge from the substrate to an external circuit is required, and no drain structures are included in the pixel. As a result, the electronic shutter eliminates the need for excess electrical contacts and metallization on an image sensor. A wide class of image sensors is well-addressed by this electronic shutter design, and therefore such is not limited to implementation in a CCD imager; the elegant, well-implemented electronic pixel structure can be configured for and applied to image sensors in general.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

I claim:

1. An electronic image sensor comprising:
   a semiconductor substrate having a first substrate surface configured for accepting illumination to an image sensor pixel, the image sensor pixel being disposed in the substrate;
   an electrically-doped channel region disposed at a second substrate surface, the second substrate surface being opposite the first substrate surface, the electrically-doped channel region collecting photogenerated charge in the substrate at the pixel;
   an electrically-doped channel stop region provided at the second substrate surface at each edge of the electrically-doped channel region, each electrically-doped channel stop region being disposed under a field oxide region;
   an electrically-doped shutter buried layer disposed in the substrate at a first depth from the second substrate surface greater than a second depth from the second substrate surface at which the electrically-doped channel region is disposed, the electrically-doped shutter buried layer extending across the pixel;
   an electrically-doped photogenerated-charge-extinguishment layer at the first substrate surface and extending across the pixel, the electrically-doped photogenerated-charge-extinguishment layer having an electrical connection for electrical biasing of the electrically-doped photogenerated-charge-extinguishment layer; and
   a substrate bulk region, between the electrically-doped shutter buried layer and the electrically-doped photogenerated-charge-extinguishment layer, the substrate bulk region being characterized by an electrical resistivity that decouples electrical biasing of the electrically-doped photogenerated-charge-extinguishment layer from the electrically-doped channel stop regions, to independently set an electrical potential in the substrate bulk region.

2. The electronic image sensor of claim 1 further comprising a pixel gate electrode provided at the second substrate surface; and wherein the electrically-doped shutter buried layer is characterized by a dopant concentration causing depletion of the electrically-doped shutter buried layer for attracting photogenerated charge to the electrically-doped channel region when the pixel gate electrode is biased at a voltage greater than a positive threshold voltage and the electrically-doped photogenerated-charge-extinguishment layer is biased at a negative voltage, the pixel gate electrode bias and electrically-doped photogenerated-charge-extinguishment layer bias attracting photogenerated charge to the pixel channel regions.

3. The electronic image sensor of claim 1 further comprising a pixel gate electrode provided at the second substrate surface, and wherein the electrically-doped photogenerated-charge-extinguishment layer is characterized by a dopant concentration causing substantial extinguishment of photogenerated charge by the electrically-doped photogenerated-charge-extinguishment layer when the pixel gate electrode is biased at a voltage that un-depletes the electrically-doped shutter buried layer and the electrically-doped photogenerated-charge-extinguishment layer is biased at a positive voltage.

4. The electronic image sensor of claim 1 further comprising a pixel gate electrode provided at the second substrate surface, and wherein a 'shutter open' condition of photogenerated charge collection at the electrically-doped channel regions is produced when the pixel gate electrode is biased at a voltage that depletes the electrically-doped shutter buried layer and the electrically-doped photogenerated-charge-extinguishment layer is biased at a negative voltage, producing an electric field in the substrate bulk region attracting photogenerated charge in the substrate to the electrically-doped channel region.

5. The electronic image sensor of claim 1 further comprising a pixel gate electrode provided at the second substrate surface, and wherein a 'shutter closed' condition of photogenerated charge extinguishment at the electrically-doped photogenerated-charge-extinguishment layer is produced when the pixel gate electrode is biased at a voltage that un-depletes the electrically-doped shutter buried layer and the electrically-doped photogenerated-charge-extinguishment layer is biased at a positive voltage, producing an electric field in the substrate bulk region attracting photogenerated charge in the substrate to the electrically-doped photogenerated-charge-extinguishment layer.

6. The electronic image sensor of claim 1 wherein the substrate comprises a silicon substrate that is characterized by a resistivity of at least about 3000 $\Omega$-cm.

7. The electronic image sensor of claim 1 wherein the semiconductor substrate comprises a silicon substrate and the electrically-doped channel region comprises an n-type dopant region.

8. The electronic image sensor of claim 1 wherein the substrate comprises a silicon substrate, the electrically-doped shutter buried layer includes a p-type dopant, and the electrically-doped photogenerated-charge-extinguishment layer includes a p-type dopant.

9. The electronic image sensor of claim 1 further comprises a gate oxide layer disposed on the second substrate surface.

10. The electronic image sensor of claim 1 wherein the electrically-doped channel region comprises a buried channel layer.

11. The electronic image sensor of claim 1 wherein the first substrate surface is a substrate back surface, for back-illumination of the image sensor.

12. The electronic image sensor of claim 1 wherein the image sensor is configured for visible and near infrared imaging and the electrically-doped photogenerated-charge-extinguishment layer is characterized by a thickness that is between about 200 nm and about 300 nm.

13. The electronic image sensor of claim 1 wherein the electrically-doped photogenerated-charge-extinguishment layer is a dopant implantation layer.

14. The electronic image sensor of claim 1 wherein the electrically-doped photogenerated-charge-extinguishment layer is characterized by a dopant concentration greater than about $10^{19}$ cm$^3$.

15. The electronic image sensor of claim 1 wherein the electrically-doped photogenerated-charge-extinguishment layer is characterized by a dopant concentration that produces Auger recombination of photogenerated charge with dopant charge in the electrically-doped photogenerated-charge-extinguishment layer.

* * * * *